United States Patent
Canseco et al.

(10) Patent No.: US 9,668,335 B1
(45) Date of Patent: May 30, 2017

(54) HEAT SINK FASTENER AND CORRESPONDING SYSTEMS AND METHODS

(71) Applicant: ARRIS Enterprises LLC, Suwanee, GA (US)

(72) Inventors: Sergio Antonio Delon Canseco, Guadalupe (MX); Luis Lopez Moreno, Apodaca (MX); Julio Cesar Ayala Vera, Apodaca (MX); Carlos Gonzalez Inda, Guadalupe (MX); Oswaldo Enrique Linares Rivas, Guadalupe (MX)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 15/050,016

(22) Filed: Feb. 22, 2016

(51) Int. Cl.
*H05K 7/20* (2006.01)
*H05K 1/02* (2006.01)
*F28F 3/02* (2006.01)
*H01L 23/473* (2006.01)
*F28D 21/00* (2006.01)

(52) U.S. Cl.
CPC ............. *H05K 1/0203* (2013.01); *F28F 3/02* (2013.01); *F28D 2021/0029* (2013.01); *F28F 2280/02* (2013.01); *H05K 2201/066* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723, 361/756, 741, 686, 687, 725, 787, 789, 361/794, 807–810; 165/80.1–80.5, 165/104.33, 185; 174/15.1–15.3, 174/16.1–16.3, 547, 548; 257/712–722, 257/E23.088; 24/453, 458–459; 454/184; 312/236
See application file for complete search history.

(56) References Cited

U.S. PATENT DOCUMENTS

| | | | |
|---|---|---|---|
| 4,607,685 A | 8/1986 | Mitchell, Jr. | |
| 5,734,556 A | 3/1998 | Saneinejad et al. | |
| 6,082,440 A * | 7/2000 | Clemens | H01L 23/4093 165/185 |
| 6,617,824 B1 | 9/2003 | Zedell et al. | |
| 6,707,676 B1 | 3/2004 | Geva et al. | |
| 6,724,632 B2 | 4/2004 | Lee et al. | |

(Continued)

*Primary Examiner* — Anthony Haughton
*Assistant Examiner* — Razmeen Gafur
(74) *Attorney, Agent, or Firm* — Lori Anne D. Swanson (57) ABSTRACT

A heat sink fastener includes a bridge, a first latch lever coupled to a first end of the bridge, and a second latch lever coupled to a second end of the bridge. The bridge defines a first fulcrum between a first force receiver and a first latch and a second fulcrum between a second force receiver and a second latch. An application force to deflect the force receivers toward each other to spring load the bridge and separate the first latch from the second latch. The bridge is then operable to unload to return the first latch and the second latch to a rest position. The first latch and the second latch engage apertures in a substrate so that springs or cantilevered spring members can bias the heat sink toward the substrate and an electronic component disposed between the heat sink and the substrate.

20 Claims, 9 Drawing Sheets

(56) References Cited

U.S. PATENT DOCUMENTS

| | | | | |
|---|---|---|---|---|
| 6,992,893 B2* | 1/2006 | Miyamura | H01L 23/4093 | 165/80.3 |
| 7,123,482 B2* | 10/2006 | Barsun | H01L 23/4093 | 165/80.3 |
| 7,606,037 B2* | 10/2009 | Chang | H01L 23/4093 | 165/80.3 |
| 7,808,790 B2* | 10/2010 | Lin | H01L 23/4093 | 165/80.3 |
| 7,848,107 B2 | 12/2010 | Wang et al. | | |
| 2002/0079097 A1* | 6/2002 | Lee | H01L 23/3677 | 165/185 |
| 2002/0181205 A1* | 12/2002 | Shia | H01L 23/4093 | 361/704 |
| 2006/0283577 A1* | 12/2006 | Liu | F28D 15/043 | 165/104.26 |
| 2007/0006992 A1* | 1/2007 | Liu | F28D 15/0266 | 165/104.26 |
| 2007/0012427 A1* | 1/2007 | Liu | H01L 23/427 | 165/104.26 |
| 2007/0127214 A1* | 6/2007 | Chen | H01L 23/4093 | 361/709 |
| 2008/0062646 A1* | 3/2008 | Foster | H01L 23/467 | 361/697 |
| 2008/0099189 A1* | 5/2008 | Suh | F28D 15/0266 | 165/104.21 |
| 2009/0009963 A1* | 1/2009 | Chang | H01L 23/4093 | 361/690 |
| 2009/0116195 A1* | 5/2009 | Yang | H01L 23/3675 | 361/709 |
| 2009/0161314 A1* | 6/2009 | Liu | H01L 23/4093 | 361/697 |
| 2009/0251853 A1* | 10/2009 | Martin | H02B 1/56 | 361/677 |
| 2010/0326626 A1* | 12/2010 | Schultz | H01L 23/473 | 165/80.4 |
| 2011/0051373 A1* | 3/2011 | McColloch | G02B 6/4201 | 361/709 |
| 2012/0069526 A1* | 3/2012 | Tissot | H05K 7/20809 | 361/720 |
| 2012/0092826 A1* | 4/2012 | Heidepriem | G06F 1/20 | 361/679.54 |
| 2013/0077253 A1* | 3/2013 | Macall | G02B 6/4261 | 361/715 |
| 2013/0083488 A1* | 4/2013 | Watanabe | H01L 23/10 | 361/719 |
| 2015/0282386 A1* | 10/2015 | Hayakawa | H05K 7/20354 | 165/104.33 |
| 2015/0296663 A1* | 10/2015 | Lin | F28F 99/00 | 165/185 |

* cited by examiner

*-- PRIOR ART --*

US 9,668,335 B1

HEAT SINK FASTENER AND CORRESPONDING SYSTEMS AND METHODS

BACKGROUND

Technical Field

This disclosure relates generally to heat sink assemblies, and more particularly to heat sink assemblies for integrated circuit applications.

Background Art

Technology in the field of electronic integrated circuits continues to advance. Modern semiconductor devices of integrated circuits continue to get smaller while offering more processing power. While the reduction in size leads to more compact electronic devices, the increased processing power requires the removal of thermal energy from the integrated circuit to ensure reliable performance. One method of removing thermal energy from an integrated circuit is with a heat sink. Heat sinks have a large, thermally conductive surface area that conducts and radiates thermal energy away from electronic components.

Many modern processor integrated circuits are constructed in a plastic or ceramic package, which is coupled to a printed wiring board by way of external leads or solder balls. Heat sinks are frequently mounted along a major face of the integrated circuit to remove thermal energy. While heat sinks come in various shapes and sizes, to be effective, a thermally conductive surface of the heat sink should be held securely against the surface of the electronic component to be cooled.

Illustrating by example, microprocessor integrated circuits are generally coupled to a printed wiring board by an array of solder balls disposed along the bottom of the integrated circuit. A heat sink is then placed atop the integrated circuit and is bolted to a boss to "lock" the heat sink in place with a tight thermal coupling between the top of the integrated circuit and the bottom of the heat sink.

While heat sinks work well in practice, prior art methods of thermally coupling a heat sink to an integrated circuit can be problematic. If, for example, screws are not evenly tightened, the underlying integrated circuit or its electrical connections to the printed wiring board can become damaged. It would be advantageous to have an improved heat sink assembly that reduces the incidence of integrated circuit or electrical connection damage during attachment of the heat sink to an underlying electrical component.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. The terms "about" or "substantially" are used herein to refer to measurements or alignments inclusive of manufacturing tolerances. Thus, a "substantially orthogonal angle" with a manufacturing tolerance of plus or minus two degrees would include all angles between 88 and 92 degrees, inclusive. Also, reference designators shown herein in parenthesis indicate components shown in a figure other than the one in discussion. For example, talking about a device (10) while discussing figure A would refer to an element, 10, shown in figure other than figure A.

Figure 15:
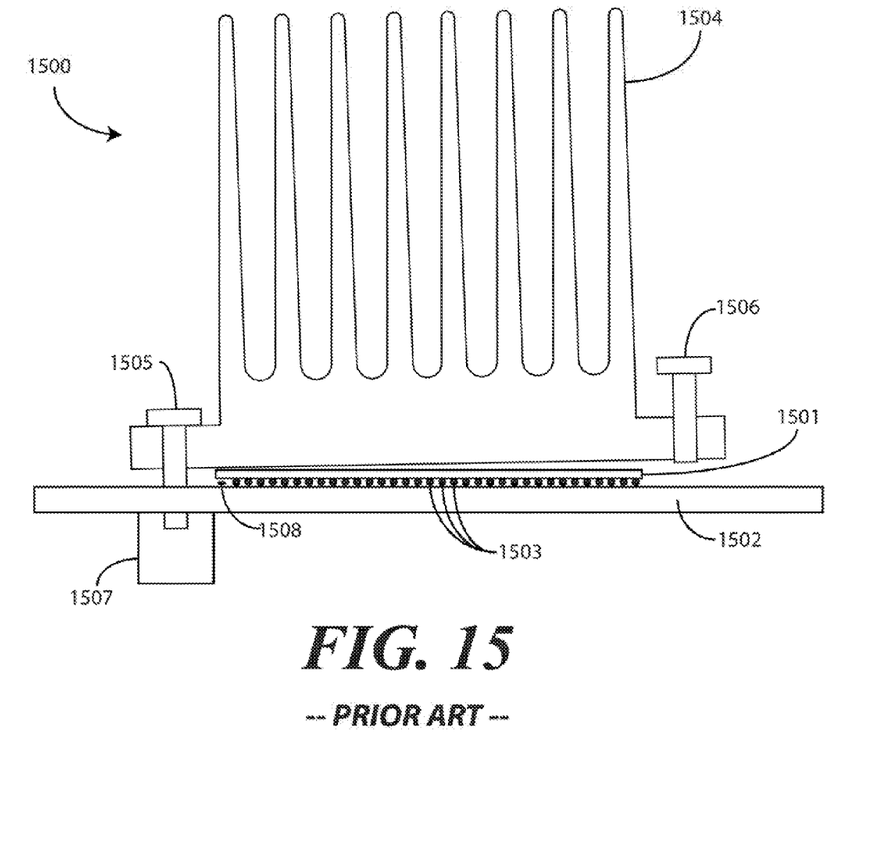
FIG. 15 illustrates a prior art heat sink assembly.

As noted above, problems exist with prior art heat sink assemblies. Turning now to FIG. 15, illustrated therein is one such prior art heat sink assembly 1500. As shown in FIG. 15, a microprocessor 1501 is coupled to a printed wiring board 1502 by an array of solder balls 1503. In this embodiment, the array of solder balls 1503 is disposed along the bottom of the microprocessor 1501. A heat sink 1504 is then placed atop the microprocessor 1501.

To function properly, tight thermal coupling is required between the heat sink 1504 and the top surface of the microprocessor 1501. This tight coupling is achieved by threading one or more screws 1505,1506 into mechanical bosses 1507 disposed along the bottom of the printed wiring board 1502. As one may imagine, this "bolting down" of the heat sink 1504 is problematic for a variety of reasons.

To begin, it is logistically challenging to drive the screws 1505,1506 into the mechanical bosses 1507. This is true because the screws are on one side of the printed wiring board 1502 while the mechanical bosses 1507 are on the other side. As both the screws 1505,1506 and the mechanical bosses 1507 can be quite small, a great deal of manual dexterity is required to properly align a screw 1505 with its corresponding mechanical boss 1507. This is time consuming, expensive, and cumbersome. Even where a fixture is used to assist in aligning the screws 1505,1506 with the mechanical boss 1507, the fixtures are expensive and are cumbersome to use.

A more problematic issue is also shown in FIG. 15. Embodiments of the disclosure contemplate that a technician will invariably tighten one screw, e.g., screw 1505, prior to tightening the other screw, e.g., screw 1506. This causes the heat sink 1504 to tilt, as shown in FIG. 15, compressing the left side of the microprocessor 1501 more than the right side in this example. This can result in an over-loading condition on the left side of the microprocessor 1501, thereby damaging the microprocessor 1501 itself or one or more of the solder balls 1503. In this example, solder ball 1508 has become damaged, thus leaving an open circuit between the printed wiring board 1502 and a connection of the microprocessor 1501. Even where immediate damage does not occur, the mechanical loading force applied to the left side of the microprocessor 1501 can stress one or more solder balls 1508, making them susceptible to fractures from the mechanical stress occurring during heat sink assembly. In addition to the damage on the solder balls 1508, the mechanical loading force applied to the left side of the microprocessor 1501 can physically damage the microprocessor 1501 itself when the silicon die within the microprocessor 1501 is stressed by uneven pressure. The housing of the microprocessor 1501 can also be damaged, thereby compromising reliability due to stress concentrations or uneven pressure applied by the heat sink 1504.

Even where elements other than screws are used to couple the heat sink 1504 against the microprocessor 1501, such as push pins or Z-clips, the same difficulties occur. Invariably, one pushpin or one end of a Z-clip gets installed before the other. An uneven assembly results, thus compromising the reliability of the entire electronic assembly.

Embodiments of the disclosure solve this issue. Embodiments of the disclosure provide a heat sink fastener having a bridge, a first latch lever coupled to a first end of the bridge, and a second latch lever coupled to a second end of the bridge. In one embodiment, the first end of the bridge defines a first fulcrum between a first force receiver and a first latch of the first latch lever, while the second end of the bridge defines a second fulcrum between a second force receiver and a second latch of the second latch lever. The first force receiver and the second force receiver, which are configured as finger grips in one or more embodiments, are then operable in response to an application force to deflect toward each other to spring load the bridge and separate the first latch from the second latch from a rest position. When the first force receiver and the second force receiver are released, the bridge is operable to unload to return the first latch and the second latch to the rest position.

The heat sink fastener is operable to couple a heat sink to an underlying electronic circuit component. In one or more embodiments, spring disposed between the heat sink fastener and the heat sink biases the heat sink toward the electronic circuit component. In one embodiment, the spring comprises a coiled spring mounted to one or more bosses on the heat sink. When assembled, the one or more bosses of the heat sink engage corresponding apertures disposed along the bridge of the heat sink fastener. In another embodiment, the springs are integrated into the heat sink fastener in the form of cantilevered spring members extending from the bridge toward the heat sink. Other spring designs will be obvious to those of ordinary skill in the art having the benefit of this disclosure.

Advantageously, embodiments of the disclosure provide a heat sink assembly consisting of two (where the springs are integrated into the heat sink fastener in the form of cantilevered spring members extending from the bridge toward the heat sink) or three (where the springs are coiled springs mounted to one or more bosses on the heat sink that engage corresponding apertures disposed along the bridge of the heat sink fastener) components. The bridge, first latch lever, and second latch lever of the heat sink fastener facilitate an easy and even assembly in a reduced assembly time.

Advantageously, embodiments of the disclosure reduce the amount of time required to assemble or replace a heat sink assembly. Additionally, embodiments of the disclosure allow the first latch and the second latch to engage apertures in a substrate, such as a printed wiring board, at the same time. This prevents the uneven mechanical loading that occurs with prior art heat sink assemblies such as that shown in FIG. 15. Accordingly, embodiments of the disclosure facilitate coupling of a heat sink to an electronic component with even force on each side, thereby reducing or eliminating mechanical stress on the electronic component and improving its performance. Moreover, embodiments of the disclosure eliminate the need for expensive fixtures during the heat sink assembly process. Embodiments of the disclosure advantageously eliminate the need for expensive or customized tools as well. Embodiments of the disclosure are also applicable to a wide variety of products. Additional advantages of embodiments of the disclosure will be obvious to those of ordinary skill in the art having the benefit of this disclosure.

Figures 1, 2:
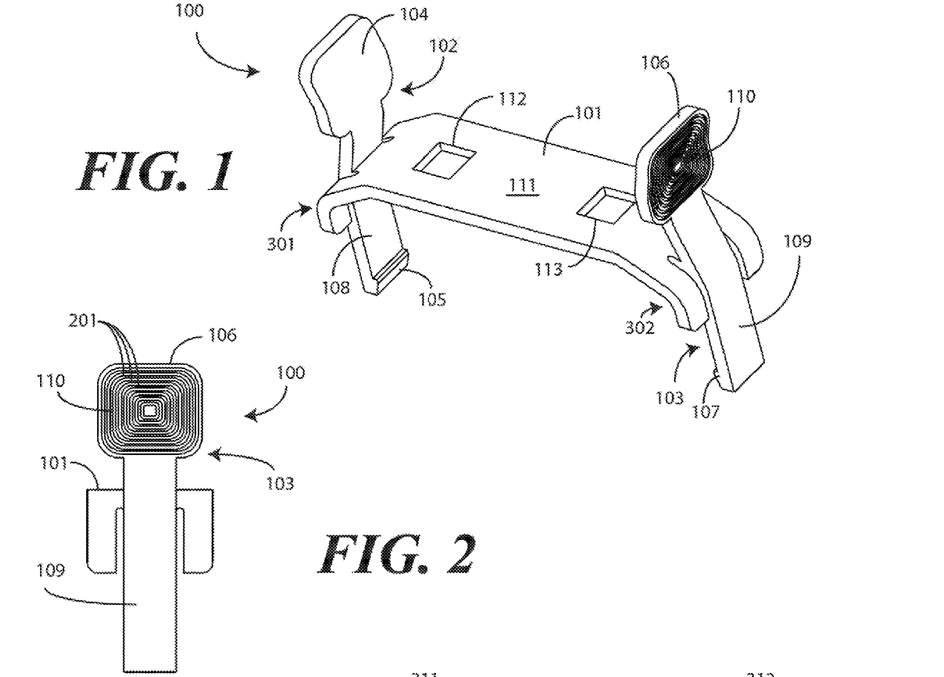
FIG. 1 illustrates a perspective view of one explanatory heat sink fastener in accordance with one or more embodiments of the disclosure.
FIG. 2 illustrates a side elevation view of one explanatory heat sink fastener in accordance with one or more embodiments of the disclosure.
Figure 3:
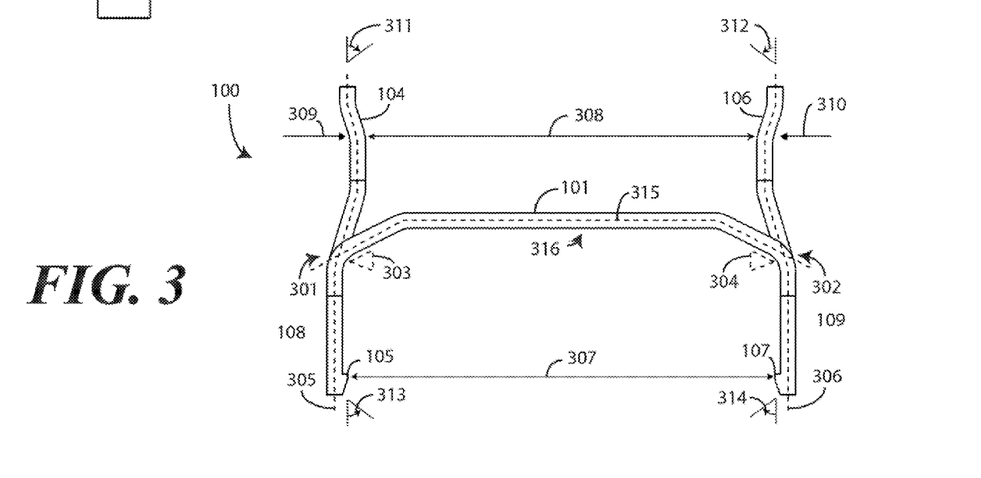
FIG. 3 illustrates a front elevation view of one explanatory heat sink fastener in accordance with one or more embodiments of the disclosure.

Turning now to FIGS. 1-3, illustrated therein is one embodiment of a heat sink fastener 100 configured in accordance with one or more embodiments of the disclosure. In one embodiment, the heat sink fastener 100 comprises a bridge 101, a first latch lever 102, and a second latch lever 103. In this illustrative embodiment, the first latch lever 102 is disposed at a first end 301 of the bridge 101, while the second latch lever 103 is disposed at a second end 302 of the bridge 101. In one embodiment, the bridge 101, first latch lever 102, and second latch lever 103 are manufactured as a unitary part, meaning that the bridge 101, first latch lever 102, and second latch lever 103 are integrally formed into a single part as opposed to coupling either the first latch lever 102 or the second latch lever 103 to the bridge 101.

In one embodiment, the bridge 101, first latch lever 102, and second latch lever 103 of the heat sink fastener 100 are manufactured from plastic by way of an injection molding process. It will be obvious to those of ordinary skill in the art having the benefit of this disclosure that the bridge 101, first latch lever 102, and second latch lever could be manufactured from other materials, including springy metal. In one or more embodiments, plastic is preferred due to the ease of manufacture, light weight, high cycle life, and low cost. However, springy metal, metal strips, or other materials can be used in other embodiments.

In one embodiment, the first end 301 of the bridge 101 defines a first fulcrum 303 disposed between a first force receiver 104 and a first latch 105. In one embodiment, the second end 302 of the bridge defines a second fulcrum 304 disposed between a second force receiver 106 and a second latch 107. In this illustrative embodiment, the first latch lever 102 comprises a first arm 108 disposed between the first latch 105 and the first force receiver 104, while the second latch lever 103 comprises a second arm 109 disposed between the second latch 107 and the second force receiver 106.

As best seen in FIG. 3, in this illustrative embodiment each of the first arm 108 and the second arm 109 is defined by a piecewise linear major axis 305,306. For example, in this embodiment the first arm 108 is defined by a piecewise linear major axis 305 having five segments, while the second arm 109 is also defined by a piecewise linear major axis 306 comprising five segments. In other embodiments, the piecewise linear major axes 305,306 will have more or fewer segments. In still other embodiments, the piecewise linear major axis 305 defining the first arm 108 will have more, or fewer, segments than does the piecewise linear major axis 306 defining the second arm 109. Additionally, the piecewise linear major axes 305,306 may be substituted with curvilinear major axes or linear major axes as well, each having a single curvilinear or straight segment, respectively. Other configurations for the first arm 108 and the second arm 109 will be obvious to those of ordinary skill in the art having the benefit of this disclosure.

In this illustrative embodiment, the piecewise linear major axes 305,306 result in the first force receiver 104 and the second force receiver 106 being closer together than are the first latch 105 and the second latch 107. Said differently, as best seen in FIG. 3, in one embodiment a distance 307 between the first latch 105 and the second latch 107 is greater than another distance 308 between the first force receiver 104 and the second force receiver 106 when the first latch 105 and the second latch 107 are in a rest position. The rest position is shown in FIG. 3.

In one or more embodiments, the first force receiver 104 and the second force receiver 106 are operable, in response to an application force 309,310, to deflect 311,312 toward each other to spring load the bridge 101 and separate 313,314 the first latch 105 from the second latch 107 from the rest position of FIG. 3. Accordingly, a technician can squeeze the first force receiver 104 and the second force receiver 106 together to separate 313,314 the first latch 105 from the second latch 107 from the rest position. Once the application force 309,310 is removed, the bridge 101 is then operable to unload to return the first latch 105 and the second latch 107 to the rest position. Thus, when the technician releases the first force receiver 104 and the second force receiver 106, the first latch 105 and the second latch 107 will move toward each other due to the unloading of the bridge.

In one or more embodiments, each of the first force receiver 104 and the second force receiver 106 defines a finger grip 110. In this illustrative embodiment, the finger grip 110 comprises a plurality of concentric ridges 201 that increase a friction coefficient along the finger grip 110. In this illustrative embodiment, the plurality of concentric ridges is generally rectangular, i.e., rectangular with curved corners. Other shapes can be substituted for the generally rectangular concentric ridges 201, however. The plurality of concentric ridges 201 can be circular, ovular, pentagonal, hexagonal, and so forth. Additionally, in other embodiments the plurality of concentric ridges 201 can be replaced by other textures or surface coatings that increase the friction coefficient to provide a comfortable, secure location at which a technician may apply the application force 309,310 with fingers to separate the first latch 105 from the second latch 107.

In this illustrative embodiment, due to the fact that multiple segments of the piecewise linear major axes 305, 306 pass through the portion of the first latch lever 102 and the second latch lever 103, respectively, the finger grips 110 of the first force receiver 104 and the second force receive 106 define non-planar surfaces. This is best seen in FIG. 1, where finger grip 110 comprises a square grasping surface that is bent from the center of the square grasping surface outward as the finger grip 110 extends away from the bridge 101. Those of ordinary skill in the art having the benefit of this disclosure will understand that the finger grip 110 can be planar instead, and can take different shapes. For example, the finger grip 110 can comprise a round grasping surface that is concave outward, planar, or convex outward.

As best seen in FIG. 3, in this illustrative embodiment the bridge 101 is also defined by a piecewise linear major axis 316. In this illustrative embodiment, the piecewise linear major axis 316 of the bridge 101 includes three segments, as this provides preferred loading and unloading to move the first latch 105 and the second latch 107 apart or together, respectively. As with the piecewise linear major axes 305, 306 of the first latch lever 102 and the second latch lever 103, the piecewise linear major axis 315 of the bridge 101 may be substituted with curvilinear major axes or linear major axes as well, each having a single curvilinear or straight segment, respectively. Other configurations for the bridge 101 will be obvious to those of ordinary skill in the art having the benefit of this disclosure.

In this illustrative embodiment, the piecewise linear major axis 316 of the bridge 101 results in the major surfaces, i.e., the top 111 and bottom 316 surfaces of the bridge 101, being concave to the first latch 105 and the second latch 107 and convex to the first force receiver 104 and the second force receiver 106, respectively. This is best shown in FIG. 3 where the three segments of the piecewise linear major axis 315 of the bridge 101 results in the bridge 101 resembling a downward facing arch where the bottom 316 surface is concave as seen by the first latch 105 and the second latch 107, and the top 111 is convex as seen by the first force receiver 104 and the second force receiver 106.

In this illustrative embodiment, the bridge 101 defines one or more apertures 112,113. As will be shown in more detail below, in one embodiment a heat sink operable with the heat sink fastener 100 of FIGS. 1-3 includes one or more bosses that engage the one or more apertures 112,113 on a one-to-one basis. In this illustrative embodiment, the one or more apertures 112,113 are substantially square in shape. However, embodiments of the disclosure are not so limited. The one or more apertures 112,113 can be circular, ovular, pentagonal, hexagonal, and so forth. Still other shapes will be obvious to those of ordinary skill in the art having the benefit of this disclosure.

Figure 4:
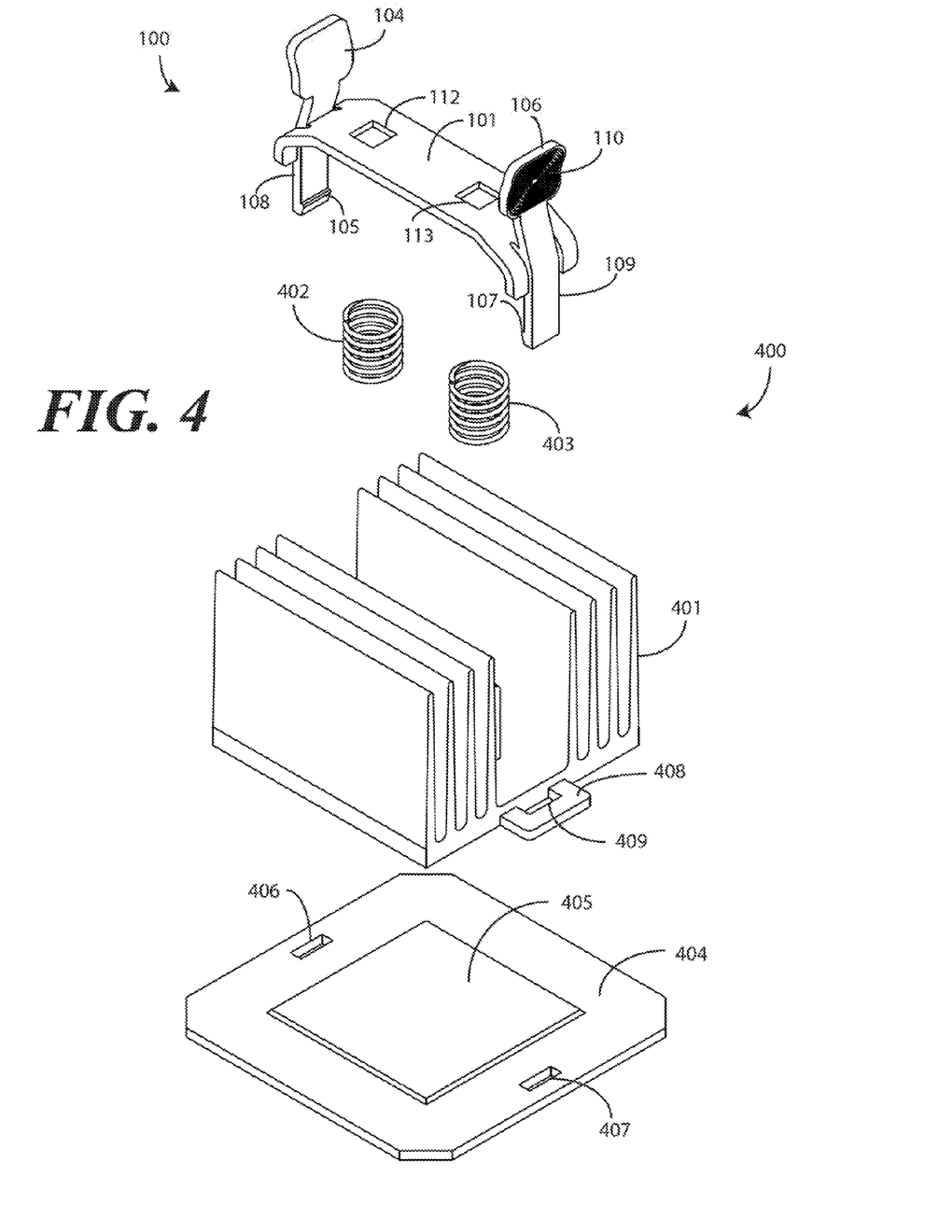
FIG. 4 illustrates an exploded view of one explanatory heat sink assembly in accordance with one or more embodiments of the disclosure.
Figure 5:
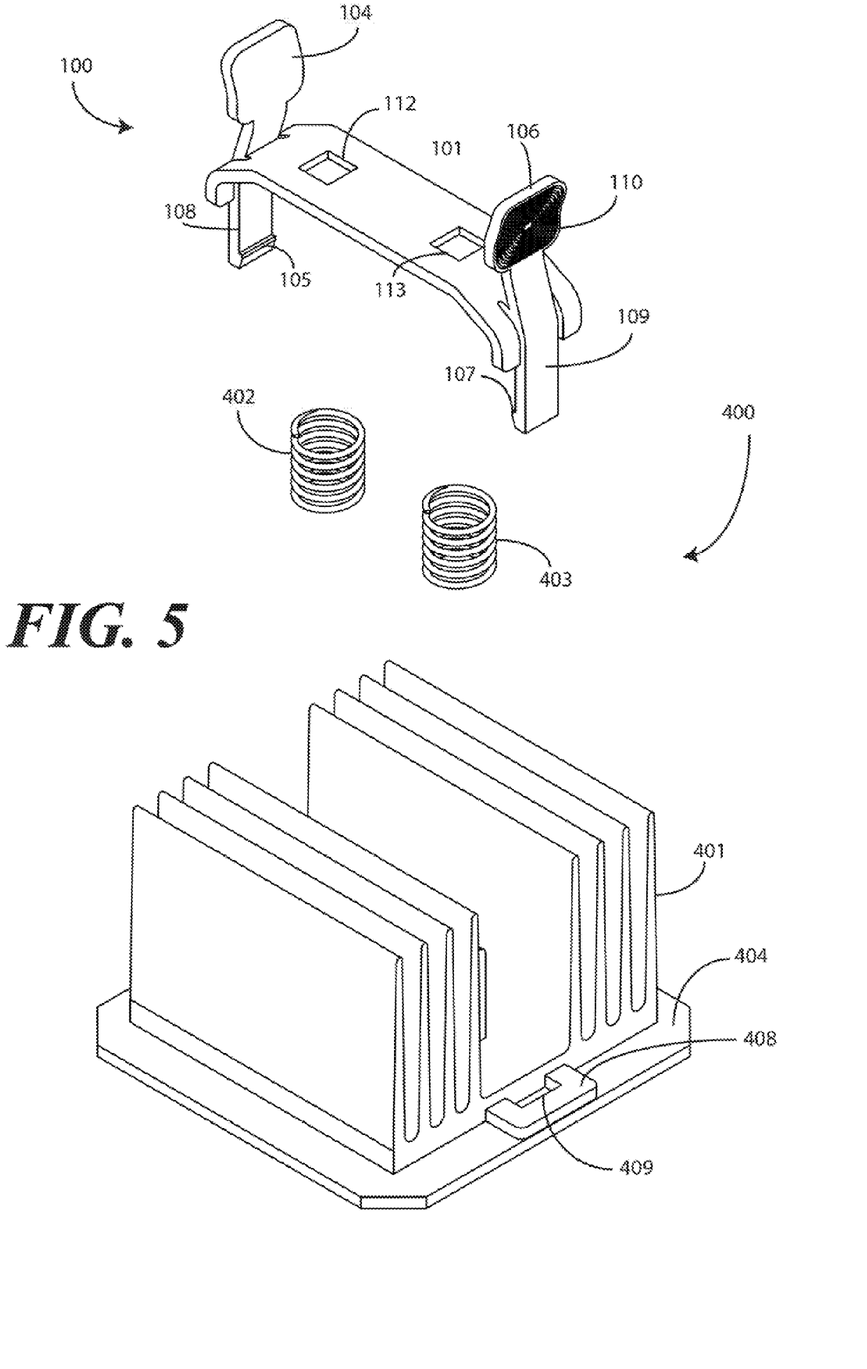
FIG. 5 illustrates a partially assembled view of one explanatory heat sink assembly in accordance with one or more embodiments of the disclosure.
Figure 6:
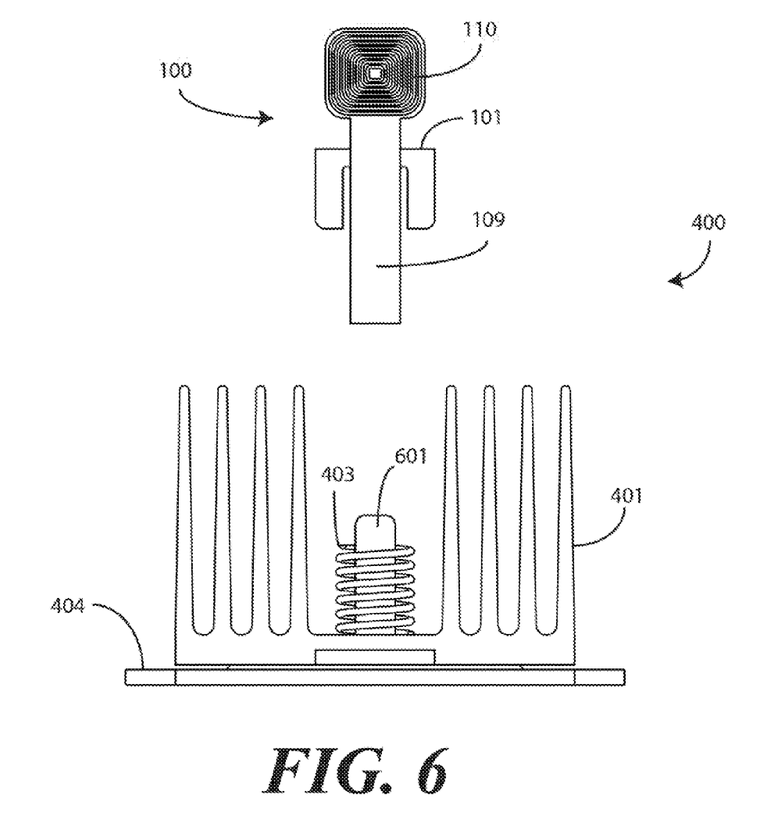
FIG. 6 illustrates a partially assembled view of one explanatory heat sink assembly in accordance with one or more embodiments of the disclosure.

Turning now to FIGS. 4-6, illustrated therein are one explanatory embodiment of a heat sink system 400 using the heat sink fastener 100 of FIGS. 1-3 in accordance with one or more embodiments of the disclosure. FIG. 4 illustrates an isometric exploded view, while FIG. 5 illustrates an isometric partially assembled view and FIG. 6 illustrates a side elevation partially assembled view.

In one or more embodiments, the heat sink system 400 includes the heat sink fastener 100, a heat sink 401, and one or more springs 402,403. In this illustrative embodiment, each spring 402,403 comprises a coil spring. As best shown in FIG. 6, in one embodiment the heat sink 401 defines one or more bosses 601. In this illustrative embodiment, the heat sink 401 defines two bosses (a second boss is hidden behind boss 601 in FIG. 6) that are to engage the two apertures 112,113 defined in the bridge 101 of the heat sink fastener 100. In this illustrative embodiment, the one or more bosses 601 are to engage the one or more apertures 112,113 on a one to one basis.

As best seen in FIG. 4, a substrate 404 is provided. In one embodiment the substrate 404 comprises a printed wiring board. An electronic component, shown here is integrated circuit 405, is coupled to the substrate 404 to transform it to a printed circuit board. In one embodiment, the integrated circuit 405 is coupled to the substrate 404 by soldering external leads or solder balls to complementary electrical contacts disposed along the substrate 404. In this illustrative embodiment, the substrate 404 defines one or more apertures 406,407 operable to receive the first latch 105 and the second latch 107 of the heat sink fastener 100, respectively. In one or more embodiments, the heat sink 401 includes one or more retention devices 408 extending from the heat sink 401 and defining an aperture 409 through which the first arm 108 and the second arm 109 may pass when the first latch 105 and the second latch 107 engage the one or more apertures 406,407 of the substrate 404.

To assemble the heat sink system 400, a technician simply places the heat sink 401 atop the integrated circuit 405 as shown in FIG. 5, aligning the aperture 409 of the retention device 408 with corresponding apertures 406,407 in the substrate. This places the integrated circuit 405 between the heat sink 401 and the substrate 404.

The technician then places the springs 402,403 on the one or more bosses 601 as shown in FIG. 6. The technician then places their fingers on the finger grips 110 of the first force receiver 104 and the second force receiver 106 and slightly squeezes them together to load the bridge 101 and separate the first latch 105 and the second latch 107 slightly. The first arm 108 and second arm 109 then pass through the apertures 409 of the retention devices 408 and apertures 406,407 of the substrate while the bosses 601 engage the apertures 112,113 in the bridge 101 of the heat sink fastener 100.

Figure 7:
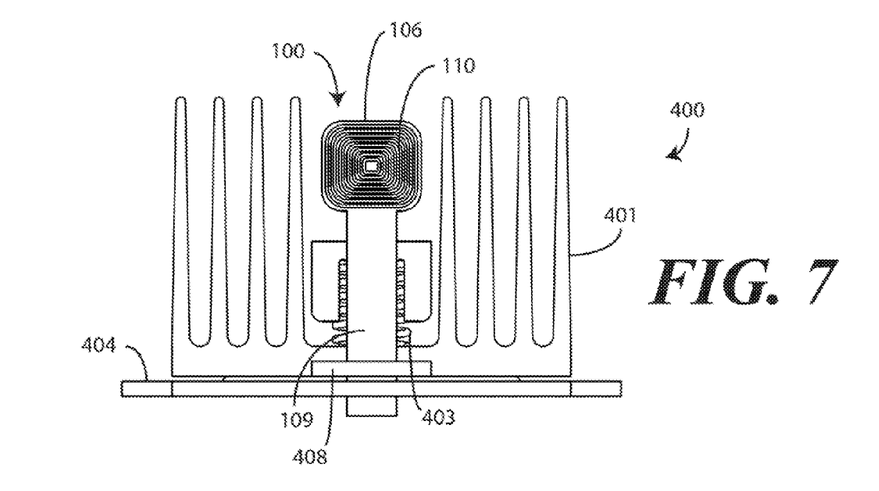
FIG. 7 illustrates an assembled view of one explanatory heat sink assembly in accordance with one or more embodiments of the disclosure.

This configuration compresses the springs 402,403 between the bridge 101 and the heat sink 401, thereby applying a loading force that biases the heat sink 401 against the integrated circuit 405. Said differently, when the springs 402,403 are positioned about the one or more bosses 601 and the bosses 601 engage the apertures 112,113 in the bridge 101, the springs compress to bias the bridge 101 away from the heat sink 401. The same spring compression causes the heat sink 401 to be biases toward the substrate 404 and against the integrated circuit 405. The technician then releases the first force receiver 104 and the second force receiver 106, thereby allowing the first latch 105 and the second latch 107 to engage the apertures 406,407 in the substrate 404. The completed heat sink system 400 is shown in FIG. 7, where the springs (402),403 bias the heat sink 401 against the integrated circuit (405) to apply a desired amount of attachment pressure between the heat sink 401 and the integrated circuit (405) for proper thermal dissipation performance.

It should be noted that the heat sink system 400 can be disassembled in the reverse order. Specifically, beginning at FIG. 7, a technician simply places their fingers on the finger grips 110 of the first force receiver (104) and the second force receiver 106 and slightly squeezes them together to load the bridge (101) and separate the first latch (105) and the second latch (107) slightly. The technician then lifts the heat sink fastener 100, thereby causing the first arm (108) and second arm 109 to pass through the apertures (409) of the retention devices 408 and apertures (406,407) of the substrate 404.

Figures 8, 9, 10:
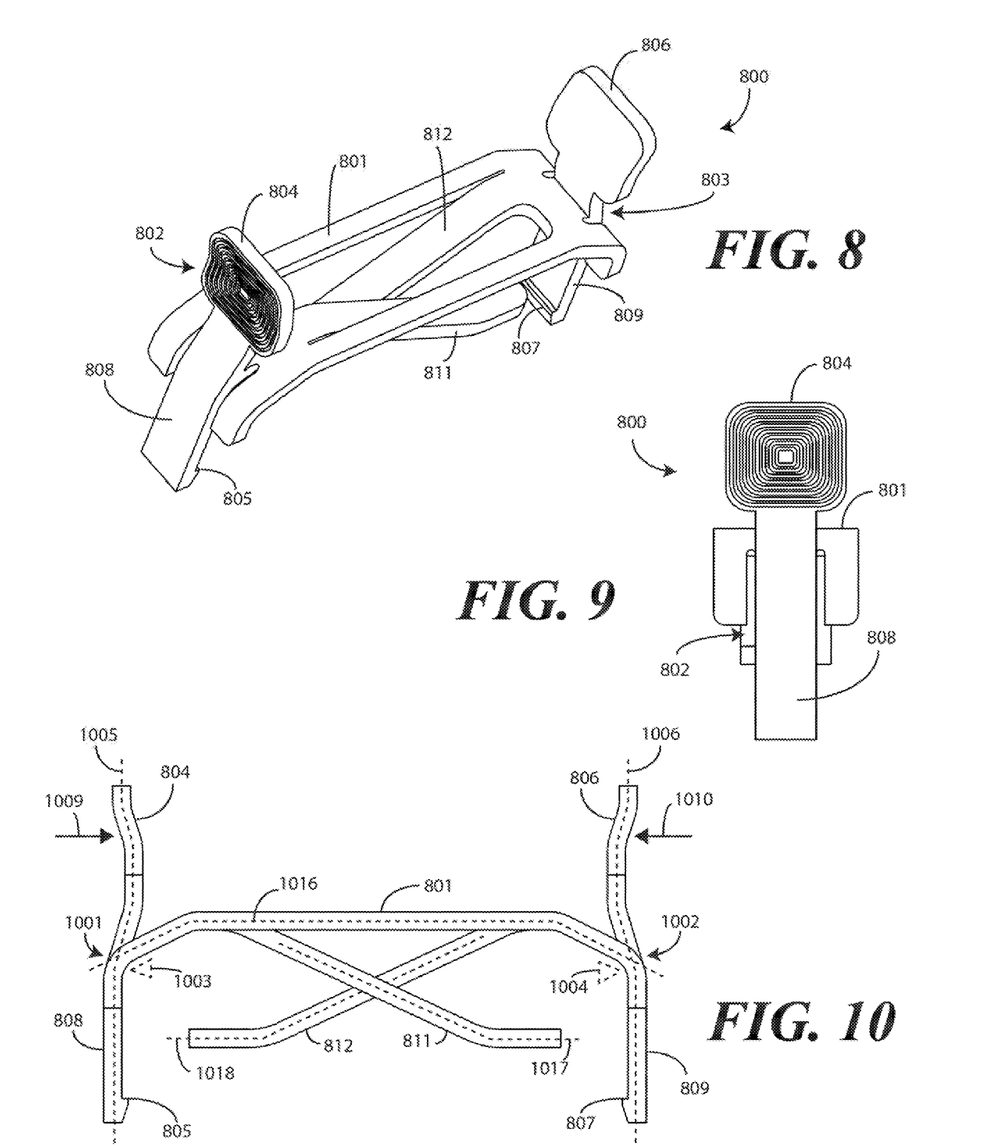
FIG. 8 illustrates a perspective view of another explanatory heat sink fastener in accordance with one or more embodiments of the disclosure.
FIG. 9 illustrates a side elevation view of another explanatory heat sink fastener in accordance with one or more embodiments of the disclosure.
FIG. 10 illustrates a front elevation view of another explanatory heat sink fastener in accordance with one or more embodiments of the disclosure.

Turning now to FIGS. 8-10, illustrated therein is another heat sink fastener 800 configured in accordance with one or more embodiments of the disclosure. This heat sink fastener 800 has many elements in common with the heat sink fastener (100) of FIGS. 1-3. For example, the heat sink fastener 800 includes a bridge 801, a first latch lever 802, and a second latch lever 803. As with the embodiments of FIGS. 1-3, the first latch lever 802 is disposed at a first end 1001 of the bridge 801, while the second latch lever 803 is disposed at a second end 1002 of the bridge 801. In this illustrative embodiment, the bridge 801, first latch lever 802, and second latch lever 803 are manufactured as a unitary part from plastic by way of an injection molding process. As noted above, other materials could be used as well, such as springy metal, stamped metal, cold rolled steel, or other metals.

In this embodiment, the first end 1001 of the bridge 801 defines a first fulcrum 1003 disposed between a first force receiver 804 and a first latch 805. In one embodiment, the second end 1002 of the bridge defines a second fulcrum 1004 disposed between a second force receiver 806 and a second latch 807. The first latch lever 802 comprises a first arm 808 disposed between the first latch 805 and the first force receiver 804, while the second latch lever 803 comprises a second arm 809 disposed between the second latch 807 and the second force receiver 806.

As with the embodiment of FIGS. 1-3, each of the first arm 808 and the second arm 809 is defined by a piecewise linear major axis 1005,1006. The piecewise linear major axes 1005,1006 may be substituted with curvilinear major axes or linear major axes as well, each having a single curvilinear or straight segment, respectively. Other configurations for the first arm 808 and the second arm 809 will be obvious to those of ordinary skill in the art having the benefit of this disclosure. The piecewise linear major axes 1005, 1006 result in the first force receiver 804 and the second force receiver 806 being closer together than are the first latch 805 and the second latch 807.

In one or more embodiments, the first force receiver 804 and the second force receiver 806 are operable, in response to an application force 1009,1010, to deflect toward each other to spring load the bridge 801 and separate the first latch 805 from the second latch 807 from the rest position of FIG. 10. Accordingly, a technician can squeeze the first force receiver 804 and the second force receiver 806 together to separate the first latch 805 from the second latch 807 from the rest position. Once the application force 1009,1010 is removed, the bridge 801 is then operable to unload to return the first latch 805 and the second latch 807 to the rest position.

In one or more embodiments, each of the first force receiver 804 and the second force receiver 806 defines a finger grip 910. As with previous embodiments, the finger grip 910 can include comprises a plurality of concentric ridges or other surface characteristics that increase a friction coefficient along the finger grip 910. As with the embodiment of FIGS. 1-3, the piecewise linear major axes 1005, 1006 pass through the finger grips 910, thereby causing the first force receiver 804 and the second force receive 806 to define non-planar surfaces. Those of ordinary skill in the art having the benefit of this disclosure will understand that the finger grip 910 can be planar instead, and can take different shapes. For example, the finger grip 910 can comprise a round grasping surface that is concave outward, planar, or convex outward.

As best seen in FIG. 10, in this illustrative embodiment the bridge 801 is also defined by a piecewise linear major axis 1016. The piecewise linear major axis 1016 of the bridge 801 may be substituted with curvilinear major axes or linear major axes as well, each having a single curvilinear or straight segment, respectively. Other configurations for the bridge 801 will be obvious to those of ordinary skill in the art having the benefit of this disclosure. In this illustrative embodiment, the piecewise linear major axis 1016 of the bridge 801 results in the major surfaces of the bridge 801 being concave to the first latch 805 and the second latch 807 and convex to the first force receiver 804 and the second force receiver 806, respectively.

In this illustrative embodiment, rather than using coiled springs like springs (402,403) from FIG. 4, springs are incorporated into the heat sink fastener 800. Specifically, in this illustrative embodiment the bridge 801 comprises one or more cantilevered spring members 811,812 extending from the bridge 801 toward one or more of the first latch 805 or the second latch 807. In this illustrative embodiment, a first cantilevered spring member 811 extends from the first end 1001 of the bridge 801 toward the second latch 807. Similarly, a second cantilevered spring member 812 extends from the second end 1002 of the bridge 801 toward the first latch 805.

In this illustrative embodiment, each cantilevered spring member 811,812 is defined by a piecewise linear major axis 1017,1018. Here, the piecewise linear major axes 1017,1018 comprise two segments such that each cantilevered spring member 811,812 resembles a hockey stick in cross section, as viewed in FIG. 10. The piecewise linear major axes 1017,1018 may be substituted with curvilinear major axes or linear major axes as well, each having a single curvilinear or straight segment, respectively. Other configurations for the cantilevered spring members 811,812 will be obvious to those of ordinary skill in the art having the benefit of this disclosure. In one or more embodiments, the heat sink fastener 800 is manufactured as a unitary part such that the cantilevered spring members 811,812 are integrally formed with the bridge 801, first latch lever 802, and second latch lever 803.

In this illustrative embodiment, the cantilevered spring members 811,812 cross each other on a side of the bridge 801 oriented toward the first latch 805 and the second latch 807. Said differently, in this embodiment the first cantilevered spring member 811 extending past the second cantilevered spring member 812 between the bridge 801 and the first latch 805 and the second latch 807. This results in the first cantilevered spring member 811 and the second cantilevered spring member 812 defining the "X" shape beneath the bridge 801 in FIG. 10. In this illustrative embodiment, the first cantilevered spring member 811 and the second cantilevered spring member 812 each share a common length. This common length results in the total force applied to a heat sink, as shown in FIGS. 11-14 below, to be in concert, i.e., the same.

Figure 11:
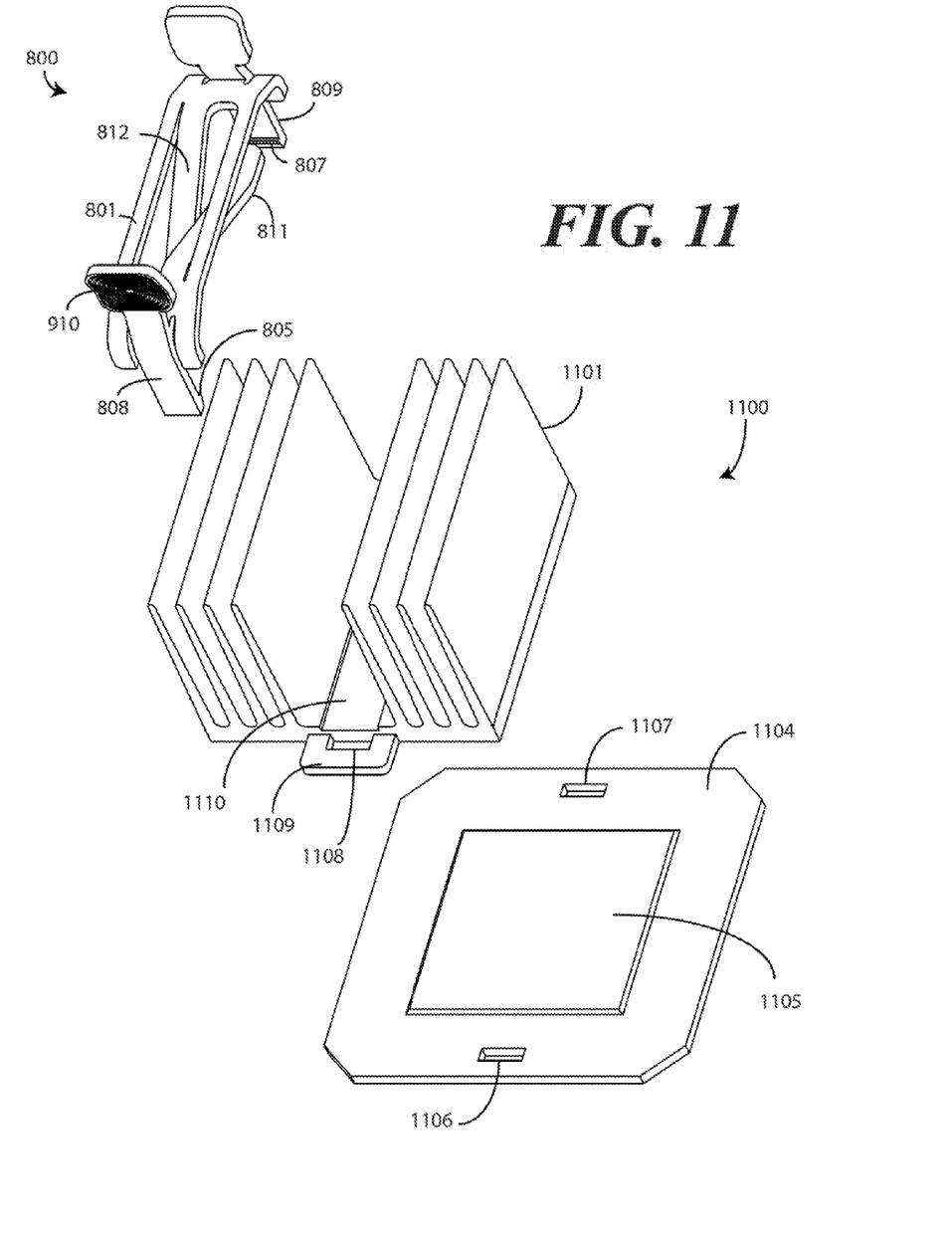
FIG. 11 illustrates an exploded view of another explanatory heat sink assembly in accordance with one or more embodiments of the disclosure.
Figure 12:
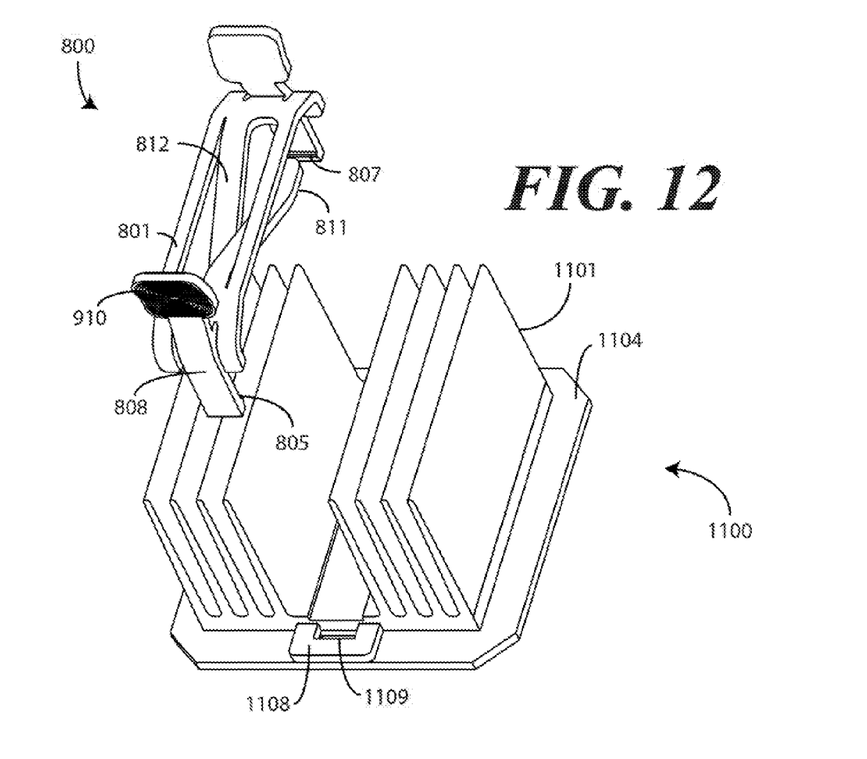
FIG. 12 illustrates a partially assembled view of another explanatory heat sink assembly in accordance with one or more embodiments of the disclosure.
Figure 13:
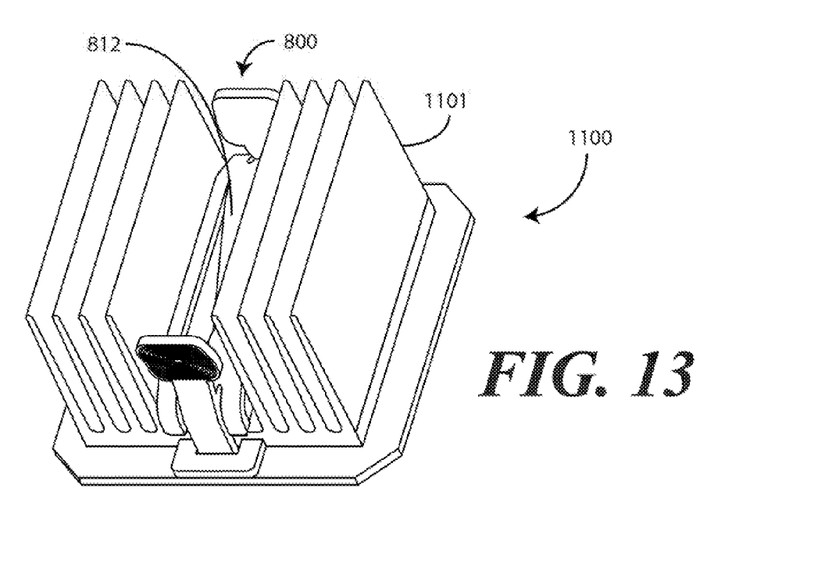
FIG. 13 illustrates an assembled view of another explanatory heat sink assembly in accordance with one or more embodiments of the disclosure.

Turning now to FIGS. 11-13, illustrated therein are one explanatory embodiment of a heat sink system 1100 using the heat sink fastener 800 of FIGS. 8-10 in accordance with one or more embodiments of the disclosure. FIG. 11 illustrates an isometric exploded view, while FIG. 12 illustrates an isometric partially assembled view and FIG. 13 illustrates an isometric assembled view.

In this illustrative embodiment, the heat sink system 1100 includes the heat sink fastener 800 and a heat sink 1101. Separate springs, such as springs (402,403), are not required due to the fact that the cantilevered spring members 811,812 are integrated into the heat sink fastener 800. This also means that the heat sink 1101 need not include bosses. Instead, it includes a flat engagement surface 1110 against which the cantilevered spring members 811,812 will apply a loading force when the heat sink fastener 800 is coupled to the substrate 1104.

An integrated circuit 1105 is coupled to the substrate 1104 by soldering external leads or solder balls to complementary electrical contacts disposed along the substrate 1104. As before, the substrate 1104 defines one or more apertures 1106,1107 operable to receive the first latch 805 and the second latch 807 of the heat sink fastener 800, respectively. In one or more embodiments, the heat sink 1101 includes one or more optional retention devices 1108 extending from the heat sink 1101 and defining an aperture 1109 through which the first arm 808 and the second arm 809 may pass when the first latch 805 and the second latch 807 engage the one or more apertures 1106,1107 of the substrate 1104.

Assembly of the heat sink system 1100 occurs generally as described above with reference to FIGS. 4-7. A technician simply places the heat sink 1101 atop the integrated circuit 1105 as shown in FIG. 12. This places the integrated circuit 1105 between the heat sink 1101 and the substrate 1104.

Figure 14:
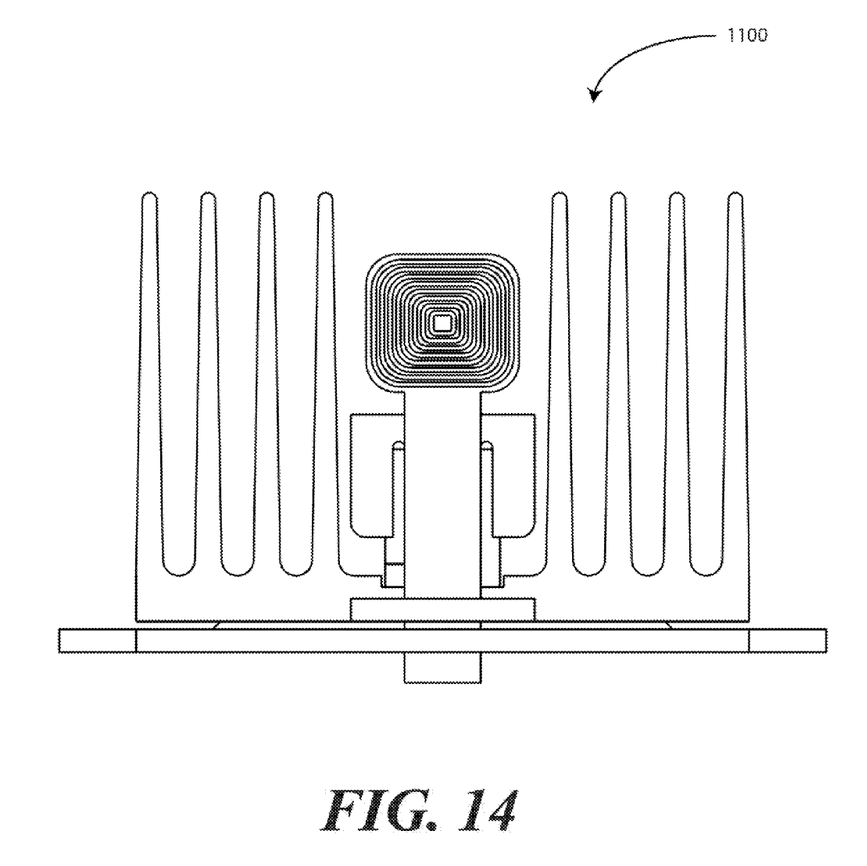
FIG. 14 illustrates an assembled view of another explanatory heat sink assembly in accordance with one or more embodiments of the disclosure.

The technician then places their fingers on the finger grips 910 of the first force receiver 804 and the second force receiver 806 and slightly squeezes them together to load the bridge 801 and separate the first latch 805 and the second latch 807 slightly. The first arm 808 and second arm 809 then pass through the apertures 1106,1107 of the substrate 1104, thereby deflecting the cantilevered spring members 811,812. This causes a loading force from the cantilevered spring members 811,812 to be applied to bias the heat sink 1101 toward the substrate 1104 and against the integrated circuit 1105. The technician then releases the first force receiver 804 and the second force receiver 806, thereby allowing the first latch 805 and the second latch 807 to engage the apertures 1106,1107 in the substrate 1104. The completed heat sink system 1100 is shown in FIGS. 13-14. The heat sink system 1100 can be disassembled in the reverse order.

Embodiments of the disclosure, be they the embodiment of FIGS. 1-7, the embodiment of FIGS. 8-14, equivalents thereof, or variants obvious to those of ordinary skill in the art having the benefit of this disclosure, offer numerous advantages over prior art designs. Illustrating by example, U.S. Pat. No. 6,707,676 to Ehood teaches a base part or a base member soldered to a substrate. A top part or a heat-sink member is then snap-coupled to the base member through a central opening of the base member. This snapping action irreversibly deforms bendable lugs that may have a radial or other shape.

By contrast, embodiments of the present disclosure do not require the base member. Nor do embodiments of the disclosure require soldering a base part to the substrate. Nor do embodiments of the disclosure require irreversibly deforming lugs. Advantageously, with embodiments of the disclosure a heat sink fastener employs a first latch lever and a second latch lever that deflect in response to an application force so that a first latch and a second latch can engage apertures in a substrate. Advantageously, with embodiments of the disclosure, and unlike the '676 patent, no tools are required to assemble or disassemble a heat sink assembly.

U.S. Pat. No. 5,734,556 to Mohsen et al. teaches an assembly for clamping a heat sink to an integrated circuit package that is mounted to a printed circuit board. The assembly includes a pair of pin headers that are mounted to the printed circuit board. The assembly also contains a clip that is snapped onto the pin headers and presses the heat sink into the package. The pin headers each have a pair of posts that extend from a spacer. The posts are soldered to the printed circuit board to secure the headers to the board. The headers also have wire loops that extend from the spacers and capture the ends of the clip.

Embodiments of the disclosure differ quite dramatically from the '556 patent. To begin, with embodiments of the disclosure no pin header is required. Moreover, no soldering operation is required. In contrast to the '556 patent, heat sink fasteners configured in accordance with embodiments of the present disclosure quickly, easily, and simply engage apertures in a substrate to securely retain a heat sink against an electronic component.

U.S. Pat. No. 6,724,632 to Lee et al. teaches a heat sink assembly that includes a back plate, a clip, and a heat sink. The back plate is attached on a first side of a circuit board, while the clip is attached on the other. This is as cumbersome and difficult to assemble as the prior art shown in FIG. 15. In any event, two posts of the back plate extend through the circuit board past the heat sink, which includes a base and fins. A longitudinal channel is transversely defined through the fins. The base defines a recess under the channel fittingly receiving an annular disc therein. The clip includes a pressing portion received in the channel, and two locking portions engage the corresponding posts. A bolt is screwed through the pressing portion to abut against the disc. By adjusting a depth to which the bolt is screwed, the clip can provide adjustable pressure acting on the heat sink.

Embodiments of the disclosure starkly differ from the teachings of the '632 patent. To begin, embodiments of the disclosure require neither screws nor a back plate. By contrast, a technician is able to quickly and reliably secure a heat sink against an electronic component from a single side of the substrate. There is no need to reach around to the other side. Moreover, embodiments of the disclosure include a first latch and a second latch that engage directly with apertures in a substrate. Desired thermal coupling pressure is given by either a helicoidally springs or by cantilevered spring members in a unitary heat sink fastener device.

U.S. Pat. No. 4,607,685 to Mitchell, Jr., teaches a heat exchange attachment device for integrated circuits. A "snap-on" holding piece permits a finned cooling unit to be threaded through an aluminum base plate attached to a pin grid array package so that a threaded shaft of the cooling unit may be screwed into adjustable contact with a beryllium oxide disk mounted on the integrated circuit package.

Embodiments of the present disclosure differ from the teachings of the '685 patent. Illustrating by example, embodiments of the present disclosure do not require any threaded features, shafts, soldering materials, or beryllium materials. By contrast, heat sink fasteners configured in accordance with embodiments of the present disclosure quickly, easily, and simply engage apertures in a substrate to securely retain a heat sink against an electronic component.

U.S. Pat. No. 7,848,107 to Wang et al teaches a heat sink system for containing and engaging a heat sink against a heat-generating component. The system includes a rectangular, integrally formed resilient frame defining a cavity in which the heat sink is contained. The frame includes a pair of opposed lateral sides and a pair of opposing gripping sides with L-shaped corner blocks depending from the intersections thereof. The gripping sides include centrally positioned grip handles extending upward and grip blocks depending therefrom, with each grip block having a grip tongue at the lower extent thereof extending inward into the cavity. Inward pressure on the grip handles forces the grip tongues outward to release objects captured thereby.

Embodiments of the disclosure differ from the teachings of the '107 patent. Illustrating by example, embodiments of the disclosure provide a heat sink fastener with a bridge that serves as a fulcrum for a first latch lever and a second latch lever so that springs or cantilevered spring members can apply a loading force to bias a heat sink against an electronic component when latches engage apertures in a substrate. Embodiments of the disclosure do not require frames disposed about a heat sink to contain the same. Additionally, embodiments of the disclosure employ latches that engage apertures in a substrate, not the integrated circuit itself. The '107 patent includes locking features, e.g., element 36 of element 34 in FIG. 1, that go under an integrated circuit, thereby applying a lifting force. This lifting force can do damage to solder balls and other connections by breaking them. By contrast, embodiments of the present disclosure employ latches that engage apertures in a substrate—rather than the integrated circuit itself—to only apply a biasing force toward the substrate.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A heat sink fastener, comprising:
   a bridge;
   a first latch lever coupled to a first end of the bridge, the first end of the bridge defining a first fulcrum between a first force receiver and a first latch; and
   a second latch lever coupled to a second end of the bridge, the second end of the bridge defining a second fulcrum between a second force receiver and a second latch;
   the first force receiver and the second force receiver operable in response to an application force to deflect toward each other to spring load the bridge and separate the first latch from the second latch from a rest position; and the bridge operable to unload to return the first latch and the second latch to the rest position.

2. The heat sink fastener of claim 1, the first latch lever comprising a first arm disposed between the first latch and the first force receiver, the first arm defined by a piecewise linear major axis.

3. The heat sink fastener of claim 2, a distance between the first latch and the second latch greater than between the first force receiver and the second force receiver when the first latch and the second latch are in the rest position.

4. The heat sink fastener of claim 2, each of the first force receiver and the second force receiver defining a finger grip.

5. The heat sink fastener of claim 4, the finger grip defining a non-planar surface.

6. The heat sink fastener of claim 5, the non-planar surface defining a plurality of concentric ridges operable to increase a coefficient of friction along the non-planar surface.

7. The heat sink fastener of claim 1, the bridge defined by a piecewise linear major axis.

8. The heat sink fastener of claim 1, the bridge defining a first major surface that is concave to the first latch and the second latch and a second major surface that is convex to the first force receiver and the second force receiver.

9. The heat sink fastener of claim 1, the bridge defining one or more apertures.

10. A heat sink system, comprising:
a bridge;
a first latch lever coupled to a first end of the bridge, the first end of the bridge defining a first fulcrum between a first force receiver and a first latch; and
a second latch lever coupled to a second end of the bridge, the second end of the bridge defining a second fulcrum between a second force receiver and a second latch;
the first force receiver and the second force receiver operable in response to an application force to deflect toward each other to spring load the bridge and separate the first latch from the second latch from a rest position; and
the bridge operable to unload to return the first latch and the second latch to the rest position;
the bridge defining one or more apertures; and
a heat sink defining one or more bosses, the one or more bosses to engage the one or more apertures on a one to one basis.

11. The heat sink system of claim 10, further comprising one or more springs disposed about the one or more bosses, the one or more springs to bias the bridge away from the heat sink.

12. The heat sink system of claim 11, further comprising a substrate defining one or more other apertures, the first latch and the second latch to engage the one or more other apertures such that the one or more springs bias the heat sink toward the substrate.

13. The heat sink system of claim 12, further comprising an integrated circuit disposed between the heat sink and the substrate.

14. A heat sink fastener, comprising:
a bridge;
a first latch lever coupled to a first end of the bridge, the first end of the bridge defining a first fulcrum between a first force receiver and a first latch; and
a second latch lever coupled to a second end of the bridge, the second end of the bridge defining a second fulcrum between a second force receiver and a second latch; and
one or more cantilevered spring members extending from the bridge toward one or more of the first latch or the second latch;
the first force receiver and the second force receiver operable in response to an application force to deflect toward each other to spring load the bridge and separate the first latch from the second latch from a rest position.

15. The heat sink fastener of claim 14, the bridge operable to unload to return the first latch and the second latch to the rest position.

16. The heat sink fastener of claim 15, the one or more cantilevered spring members comprising a first cantilevered spring member extending from the first end of the bridge toward the second latch and a second cantilevered spring member extending from the second end of the bridge toward the first latch.

17. The heat sink fastener of claim 16, each of the one or more cantilevered spring members defined by a piecewise linear major axis.

18. The heat sink fastener of claim 17, the first cantilevered spring member extending past the second cantilevered spring member between the bridge and the second latch.

19. The heat sink fastener of claim 16, further comprising:
a heat sink; and
a substrate defining one or more apertures;
the first latch and the second latch to engage the one or more apertures such that the one or more cantilevered spring members bias the heat sink toward the substrate.

20. The heat sink fastener of claim 19, further comprising an integrated circuit disposed between the heat sink and the substrate.

* * * * *